United States Patent [19]
Hedberg

[11] Patent Number: 5,995,559
[45] Date of Patent: Nov. 30, 1999

[54] METHODS FOR IMPROVED COMMUNICATION USING REPEATED WORDS

[75] Inventor: Mats Gunnar Hedberg, Hässelby, Sweden

[73] Assignee: Telefonaktiebolaget LM Ericsson, Stockholm, Sweden

[21] Appl. No.: 08/521,760

[22] Filed: Aug. 31, 1995

[51] Int. Cl.⁶ .................................................. H03D 1/00
[52] U.S. Cl. ........................... 375/340; 371/36; 371/69.1
[58] Field of Search ..................................... 375/346, 347, 375/267, 316, 340; 371/36, 69.1

[56] References Cited

U.S. PATENT DOCUMENTS

| | | | |
|---|---|---|---|
| 4,400,811 | 8/1983 | Brown et al. | 371/69.1 |
| 5,224,152 | 6/1993 | Harte | 379/59 |
| 5,426,653 | 6/1995 | Hayes et al. | 371/36 |
| 5,568,513 | 10/1996 | Croft et al. | 375/224 |

FOREIGN PATENT DOCUMENTS

| | | |
|---|---|---|
| 086 541 | 8/1983 | European Pat. Off. . |
| 185 425 | 6/1986 | European Pat. Off. . |
| 2 185 367 | 7/1987 | United Kingdom . |
| WO92/21085 | 11/1992 | WIPO . |
| WO93/18589 | 9/1993 | WIPO . |

OTHER PUBLICATIONS

A. Targi et al., "Error and Throughput Performance of Multidecoded Erasure–Based Direct Sequence/Time Hopping Selection Diversity Multiaccess Systems," IEEE International Conference on Communications ICC/Supercomm 90, vol. 4, pp. 1527–1533 (Apr. 16–19, 1990).

R. Blahut, *Theory and Practice of Error Control Codes*, chapt. 7, Addison–Wesley, Reading, MA (1983).

"CMS 88 Cellular Mobile Telephone System", pub. No. EN/LZT 101 908 R2B, chapt. 4, Ericsson Telecom AB (1988).

*Primary Examiner*—Temesghen Ghebretinsae
*Attorney, Agent, or Firm*—Burns, Doane, Swecker & Mathis, L.L.P.

[57] ABSTRACT

Instead of simply taking a bit-wise majority vote of several received encoded data words and decoding the result of the vote, the chances of usefully decoding a word may be increased by decoding every word received. If a received word is decoded as correct or with a corrected one-bit error or with a corrected two-bit error, this decoded word can be used as the received word. Also, bit-wise majority votes can be taken on all combinations of small groups of the received words, and the results passed to the decoder. If the decoder reports a correct word or a word having a one-bit or two-bit error corrected for one of these combinations, this can be used as the received word. Error-correction beyond the typical capabilities of a BCH code can be realized if the error-correction decoder is properly configured. "Wordwise" majority voting is also described. The probability of accurately determining a word that was actually transmitted from several repetitions of the word received after passage through a corrupting communication channel, especially for situations in which short bursts of erroneous data are received, is increased.

13 Claims, 11 Drawing Sheets

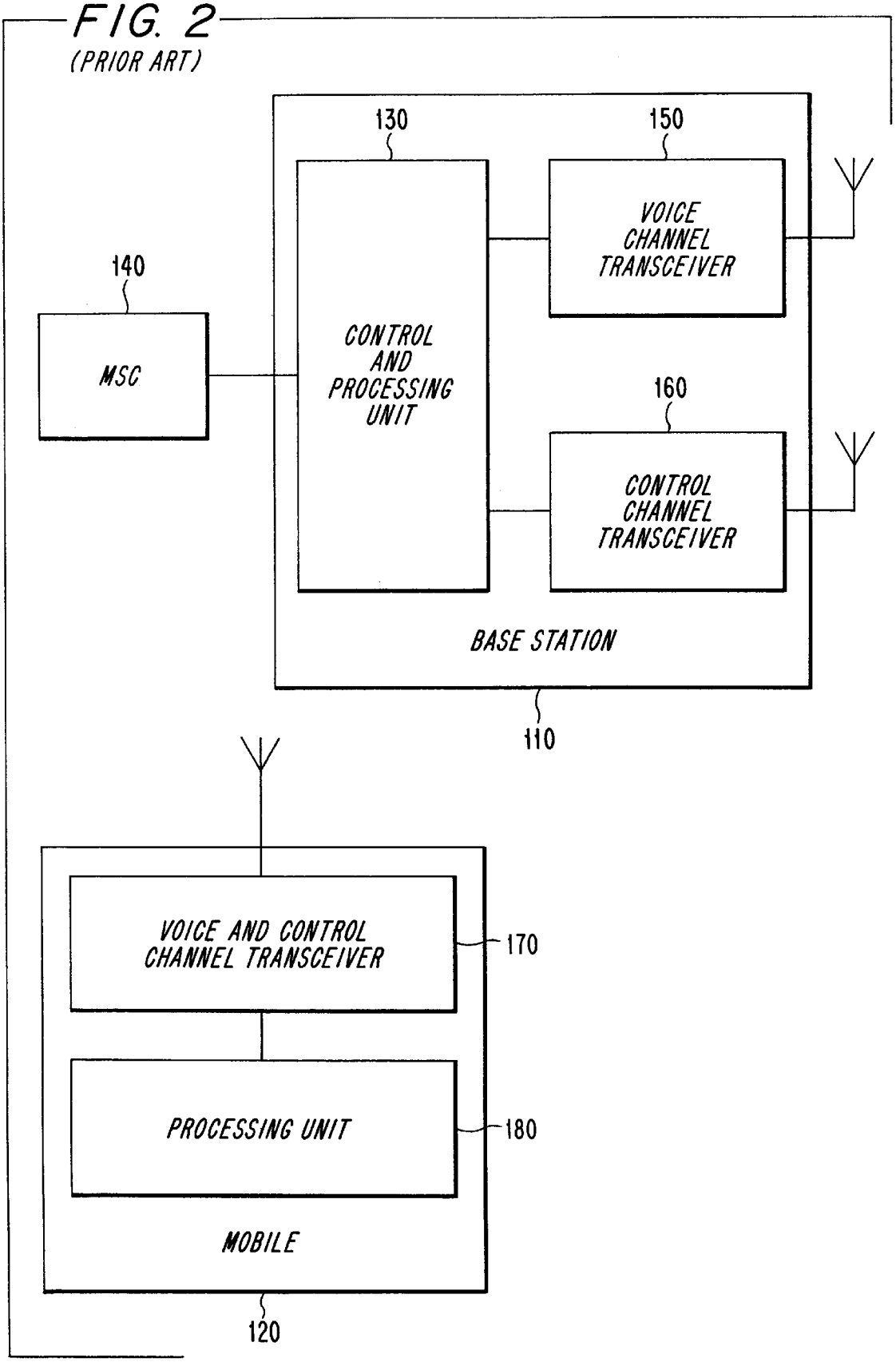

FIG. 4

| BIT SYNC | WORD SYNC | CODED DCC* | FIRST WORD REPEATED 5 TIMES | SECOND WORD REPEATED 5 TIMES | THIRD WORD REPEATED 5 TIMES | · · · |
|---|---|---|---|---|---|---|
| 30 | 11 | 7 | 240 | 240 | 240 | |

|← SEIZURE PRECURSOR →|

FIG. 6A

| NOTE | 0010 | 1100 | 0000 | 0000 | 0000 | 0000 | 0000 | 0000 | P |
|---|---|---|---|---|---|---|---|---|---|
| 4 | 4 | 4 | 4 | 4 | 4 | 4 | 4 | 4 | 12 |

FIG. 6B

| NOTE | 0001 | 0011 | 0111 | 1001 | 0010 | 0110 | 0100 | 1010 | P |
|---|---|---|---|---|---|---|---|---|---|
| 4 | 4 | 4 | 4 | 4 | 4 | 4 | 4 | 4 | 12 |

FIG. 6C

| NOTE | 1011 | 0010 | 0100 | 0010 | 0111 | 0011 | 0010 | 0101 | P |
|---|---|---|---|---|---|---|---|---|---|
| 4 | 4 | 4 | 4 | 4 | 4 | 4 | 4 | 4 | 12 |

FIG. 6D

| NOTE | 1000 | 0000 | 0000 | 0000 | 0000 | 0000 | 0000 | 0000 | P |
|---|---|---|---|---|---|---|---|---|---|
| 4 | 4 | 4 | 4 | 4 | 4 | 4 | 4 | 4 | 12 |

FIG. 5A

| F=1 | NAWC | T | S | E | RSVD =0 | SCM | $MIN1_{23-0}$ | P |
|---|---|---|---|---|---|---|---|---|
| 1 | 3 | 1 | 1 | 1 | 1 | 4 | 24 | 12 |

FIG. 5B

| F=0 | NAWC | LOCAL | ORDQ | ORDER | LT | RSVD= 0...0 | MS SUP LEV | $MIN2_{33-24}$ | P |
|---|---|---|---|---|---|---|---|---|---|
| 1 | 3 | 5 | 3 | 5 | 1 | 6 | 2 | 10 | 12 |

FIG. 5C

| F=0 | NAWC | $SERIAL_{31-0}$ | P |
|---|---|---|---|
| 1 | 3 | 32 | 12 |

FIG. 5D

| F=0 | NAWC | 1ST DIGIT | 2ND DIGIT | ... | ... | ... | ... | 7TH DIGIT | 8TH DIGIT | P |
|---|---|---|---|---|---|---|---|---|---|---|
| 1 | 3 | 4 | 4 | 4 | 4 | 4 | 4 | 4 | 4 | 12 |

FIG. 5E

| F=0 | NAWC | 9TH DIGIT | 10TH DIGIT | ... | ... | ... | ... | 15TH DIGIT | 16TH DIGIT | P |
|---|---|---|---|---|---|---|---|---|---|---|
| 1 | 3 | 4 | 4 | 4 | 4 | 4 | 4 | 4 | 4 | 12 |

FIG. 5F

| F=0 | NAWC | 17TH DIGIT | 18TH DIGIT | ... | ... | ... | ... | 23RD DIGIT | 24TH DIGIT | P |
|---|---|---|---|---|---|---|---|---|---|---|
| 1 | 3 | 4 | 4 | 4 | 4 | 4 | 4 | 4 | 4 | 12 |

FIG. 5G

| F=0 | NAWC =000 | 25TH DIGIT | 26TH DIGIT | ... | ... | ... | ... | 31ST DIGIT | 32ND DIGIT | P |
|---|---|---|---|---|---|---|---|---|---|---|
| 1 | 3 | 4 | 4 | 4 | 4 | 4 | 4 | 4 | 4 | 12 |

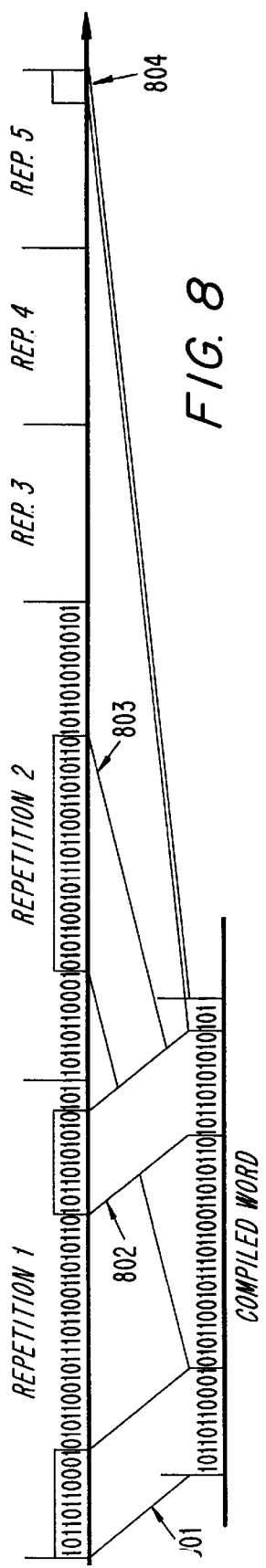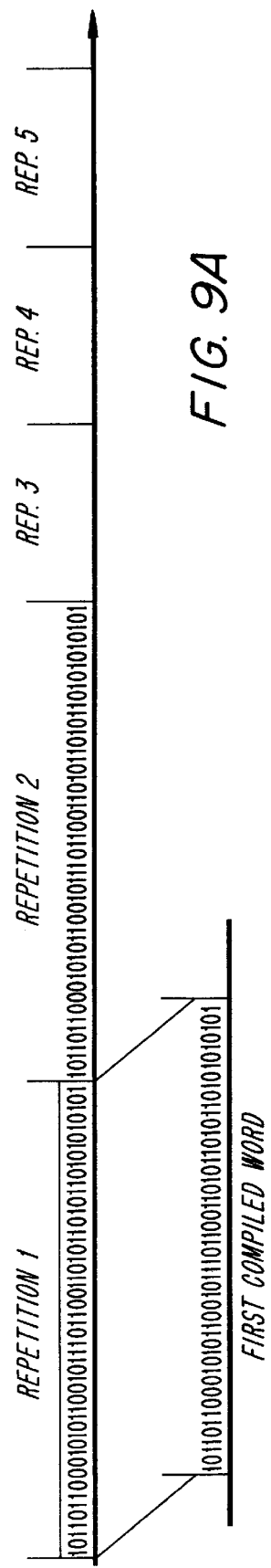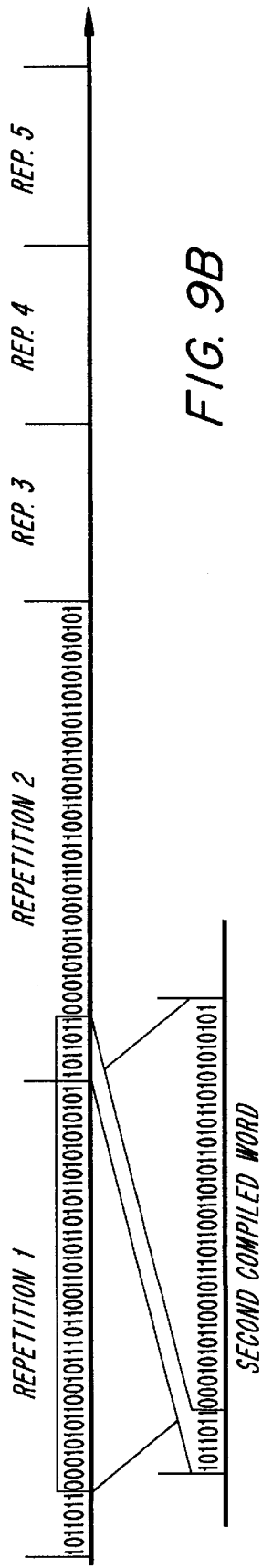

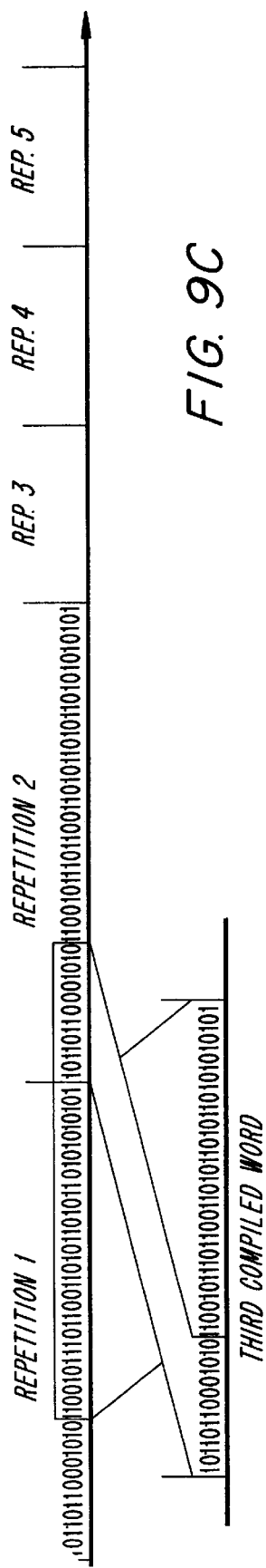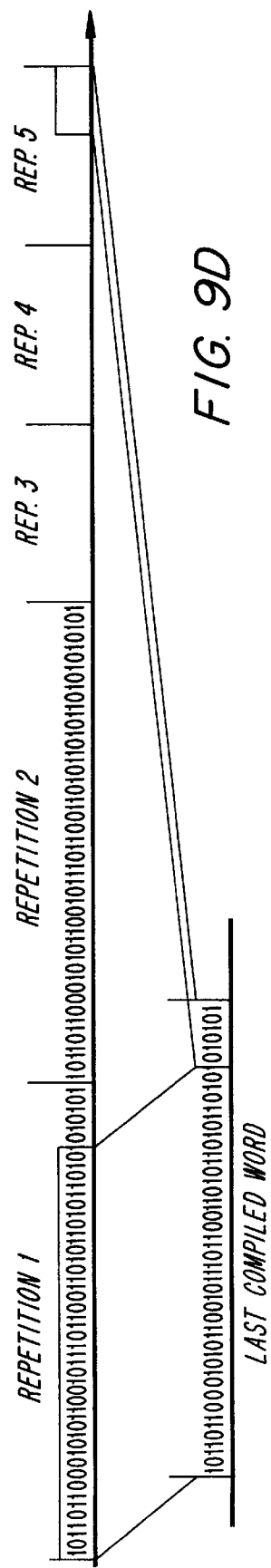

METHODS FOR IMPROVED COMMUNICATION USING REPEATED WORDS

BACKGROUND

Applicant's invention relates to communication systems in which information in the form of digital words is transmitted, and more particularly to systems in which each word is transmitted several times.

Some current cellular mobile telephone systems use analog frequency modulation (FM) of a radio-frequency (RF) carrier signal to transmit speech and other information. One of the standards is the Advanced Mobile Phone Service (AMPS) system in the U.S. that uses FM and a spacing between 880-MHz carrier signals of 30 KHz. Some of the characteristics of the AMPS system are specified by the EIA/TIA-553 standard published by the Electronic Industries Association and Telecommunications Industry Association (EIA/TIA). Another standard is the Total Access Communications System (TACS) in the United Kingdom that uses spacings of 25 KHz between 880-MHz carrier signals. The TACS and AMPS system differ in a few details that are not relevant to this application.

The capacity of such analog FM systems can be increased by reducing the channel bandwidth, as in the system according to the Narrow-band AMPS (N-AMPS) standard. In an N-AMPS system, a channel spacing of 10 KHz is achieved by splitting each 30-KHz-wide radio channel of an AMPS system into three parts. In general, a radio channel is a bi-directional radio transmission path between two transceivers, and thus the channel comprises two carriers having different frequencies, one for uplink communication (mobile station to base station) and one for downlink communication (base station to mobile station). In the standard systems, the frequency spacing between the two carriers of any radio channel is 45 MHz.

In another effort to increase system capacity, a digital AMPS (D-AMPS) system in the U.S. uses digital transmission and time-division multiple access (TDMA) on traffic channels while keeping analog transmission on control channels. In a TDMA communication system, a radio channel is divided into a succession of time slots, each of which contains a burst of information from a data source, e.g., a digitally encoded portion of a voice conversation. Successive time slots assigned to the same user, which are usually not consecutive time slots on the radio carrier, constitute the user's digital traffic channel, which may be considered a logical channel assigned to the user. Some of the characteristics of the D-AMPS system are specified by the IS-54-B standard published by the EIA/TIA.

In systems according to these analog standards, control channels are used for setting up calls, informing base stations about locations and parameters associated with mobile stations, and informing mobile stations about locations and parameters associated with base stations. Voice or traffic channels are used for carrying voice conversations and sometimes for data.

FIGS. 1A, 1B illustrate an exemplary multi-layered cellular communication system that can use any of the above-described systems. An umbrella macrocell 10 represented by a hexagonal shape (see FIG. 1A) is part of an overlying cellular structure comprising many macrocells $A_1$–$A_7$, $B_1$–$B_7$ (see FIG. 1B). Each umbrella cell may contain an underlying microcell structure. The radio coverage of the umbrella cell and an underlying microcell may overlap or may be substantially non-overlapping. The umbrella cell 10 includes microcells 20 represented by the area enclosed within the dotted line and microcells 30 represented by the area enclosed within the dashed line corresponding to areas along city streets, and picocells 40, 50, 60, which cover individual floors of a building.

FIG. 2 is a block diagram of an exemplary cellular mobile radiotelephone communication system for use with the cellular structure shown in FIGS. 1A, 1B. The communication system includes a base station 110 that is associated with a respective one of the macrocell, microcell, or picocell; a mobile station 120; and a mobile services switching center (MSC) 140. Each base station has a control and processing unit 130, which communicates with the MSC 140, which in turn is connected to the public switched telephone network (not shown). Each base station also includes at least one voice channel transceiver 150 and a control channel transceiver 160, which are controlled by the control and processing unit 130. The mobile station 120 includes a similar voice and control channel transceiver 170 for exchanging information with the transceivers 150, 160, and a similar control and processing unit 180 for controlling the voice and control channel transceiver 170.

Complicating the task of any radio communication system is interference between the several radio transmitters and the variability of the radio channel caused by relative motion of the system users, changing radio signal reflections from structures and vehicles, resulting in fading, etc. Such interference and channel variability contributes to errors in the information communicated, and much effort is expended to overcome these errors. For example, some cellular radiotelephone systems convert analog information to be transmitted into digital information, which is then transformed, or encoded, in a way that permits some errors to be corrected.

As one specific example, linear Bose-Chaudhuri-Hocquenghem (BCH) codes can be decoded with low complexity using either the Peterson-Gorenstein-Zierler procedure or the Berlekamp-Massey procedure, or any procedure for decoding cyclic codes, as described in R. Blahut, *Theory and Practice of Error Control Codes*, chapt. 7, Addison-Wesley, Reading, Mass. (1983). Such a code is specified by code parameters (n, k) with minimum Hamming distance d and with code symbol alphabet $GF(2^m)$. In essence, such a code transforms a block of k data bits into a larger block of n coded bits. The additional bits are usually called parity bits, CRC bits, or check bits. The error correcting capability t of the code, i.e., the number of errors that the code can correct, is given by $t \leq [(d-1)/2]$.

The TACS and AMPS and N-AMPS systems address the problem of interference and channel variability with such error correction coding and with redundancy. For example, a word, or block of data, to be transmitted is first encoded with a BCH code, and then the encoded word is transmitted five times. At the receiver, a majority vote is taken of each set of corresponding bits to determine the received word: corresponding bits of the five words received are compared, and for each bit position, the bit value having the majority of occurrences is taken as the bit value of the received word. This is called bit-wise majority voting in this application.

U.S. Pat. No. 5,568,513 filed May 11, 1993, entitled "Standby Power Saving in Mobile Phones" describes receiving five repetitions of a word and decoding each repetition as it is received. Upon successfully decoding one of the repetitions, the remaining repetitions are ignored; if none of the repetitions is successfully decoded, then a bit-wise majority vote of the five repetitions is taken and the voting result is decoded.

An example of bit-wise majority voting is illustrated by the following table, which shows five data words and their associated parity bits received, and the received word and parity bits resulting from a simple bit-wise majority vote.

|  | Data Bits Received | Parity Bits Received |
| --- | --- | --- |
|  | 101010101010110 | 11110101 |
|  | 111010101000101 | 01010101 |
|  | 101011010100101 | 01010101 |
|  | 101001010101010 | 01010100 |
|  | 010101001010101 | 01010101 |
| bit-wise majority vote: | 101011001000101 | 01010101 |

The bit values determined by the bit-wise majority vote are deemed to constitute the received word, which is passed to a decoder. As described below, the BCH code used by the TACS permits one-bit and two-bit errors to be corrected; if more than two bits of a word are in error, the decoder reports the word is incorrectable.

The shortcoming of such bit-wise majority voting of all of the words received is that if two of the five words received each contain more than two errors, the majority vote may produce a word that the decoder will report as incorrectable.

SUMMARY

Applicant's invention provides methods and apparatus that avoid the shortcoming of simple bit-wise majority voting of coded data words, decreasing the probability that a decoder will report a word as incorrectable.

In accordance with one aspect of Applicant's invention, a method of determining a decoded received data word from several received encoded repetitions of the data word includes the steps of compiling an encoded repetition of the data word by selecting bits from the plurality of received encoded repetitions of the data word; and decoding the compiled encoded repetition according to an error correcting code, thereby determining the decoded received data word.

The bits in the compiled encoded repetition can be selected by a window that includes the same number of contiguous bits as a received encoded repetition. Also, the bits in the compiled encoded repetition can be selected by moving a window among several positions that each include a number of contiguous bits that is less than the number of bits in a received encoded repetition.

The method can further include the step of taking a bit-wise majority vote of a compiled encoded repetition and words selected from a group that includes at least one other compiled encoded repetition and the received encoded repetitions. The result of this bit-wise voting is decoded to determine the decoded received data word. The bit-wise-vote result can be formed by taking a bit-wise majority vote of several compiled encoded repetitions. Also, the bits in a compiled encoded repetition can be selected by a window that includes the same number of contiguous bits as a received encoded repetition. The bits in a compiled encoded repetition may be selected by moving a window among several positions that each include a number of contiguous bits that is less than the number of bits in a received encoded repetition.

The compiling and decoding steps can be carried out several times to produce several decoded results, and the method can then further include the step of taking a word-wise majority vote of the decoded results. The result of the word-wise majority vote is reported as the decoded received data word. Taking a word-wise majority vote may include the step of determining a type of decoded result that has the most votes, and the decoded received data word is of the type determined. If each decoded result has a respective weight, the decoded received data word is the result of the word-wise majority vote if a sum or other appropriate combination of the weights of the decoded results in the majority of the word-wise vote meets a suitable threshold.

In another aspect of Applicant's invention, a method of determining a decoded received data word from several received encoded repetitions of the data word includes the steps of: taking a bit-wise majority vote of a selected group of the plurality of received encoded repetitions words, thereby forming a bit-wise-vote result; determining which bits of the bit-wise vote result are changeable by applying a bit mask to the bit-wise vote result; and decoding the bit-wise-vote result according to an error correcting code and the applied bit mask, thereby determining the decoded received data word.

A bit of the bit-wise vote result may be determined to be changeable based on the number of votes that bit received in the bit-wise majority vote. Also, the determining step may include determining whether a number of changeable bits is greater than a constraint value, and the decoding step may include the steps of: decoding the bit-wise-vote result, thereby forming a decoded result; if the decoded result includes an error-corrected bit and the number of changeable bits is not greater than the constraint value, then determining whether the error-corrected bit is a changeable bit; and if the error-corrected bit is a changeable bit, reporting the decoded result as the decoded received data word.

The determining step also may include determining whether a number of changeable bits is greater than a constraint value, and if the number of changeable bits is not greater than the constraint value and if the bit-wise-vote result is incorrectable in the decoding step, the decoding step may include the steps of: inverting a selected one of the changeable bits, thereby forming a modified voting result; decoding the modified voting result, thereby forming a decoded result that includes an error-corrected bit; determining whether the error-corrected bit is a changeable bit; and if the error-corrected bit is a changeable bit, reporting the decoded result as the decoded received data word. A changeable bit may be selected for inversion based on soft quality information for that bit.

BRIEF DESCRIPTION OF THE DRAWINGS

Applicant's invention is described below in more detail with reference to embodiments that are given only by way of example and that are illustrated in the accompanying drawings, in which:

FIG. 2 is a block diagram of an exemplary cellular mobile radiotelephone system;

FIG. 4 shows the format of the data stream transmitted by a mobile station on a reverse control channel in a TACS system;

FIGS. 5A–5G show formats of data words carried by a reverse control channel;

FIGS. 6A–6D show examples of encoding called-address information into called-address words;

FIG. 8 generally illustrates use of selected windows to generate a compiled word;

FIGS. 9A–9D illustrate a sliding window method, i.e., sequential analysis of repetitions to generate compiled words.

DETAILED DESCRIPTION

While the following description is in the context of cellular communication systems involving portable or mobile radiotelephones and/or personal communication networks, it will be understood by those skilled in the art that Applicant's invention may be applied to other communication systems.

A radio base station suitable for the TACS and AMPS and N-AMPS systems primarily comprises a plurality of transceiver modules for sending and receiving signals on respective radio channels and a control processing unit for exchanging signals with the MSC. (See transceivers 150, 160 in FIG. 2.) For a complete description of such an analog radio base station, the reader is referred to the literature, including "CMS 88 Cellular Mobile Telephone System", chapt. 4, publication no. EN/LZT 101 908 R2B (1988) available from Ericsson Telecom AB.

Figure 1A:
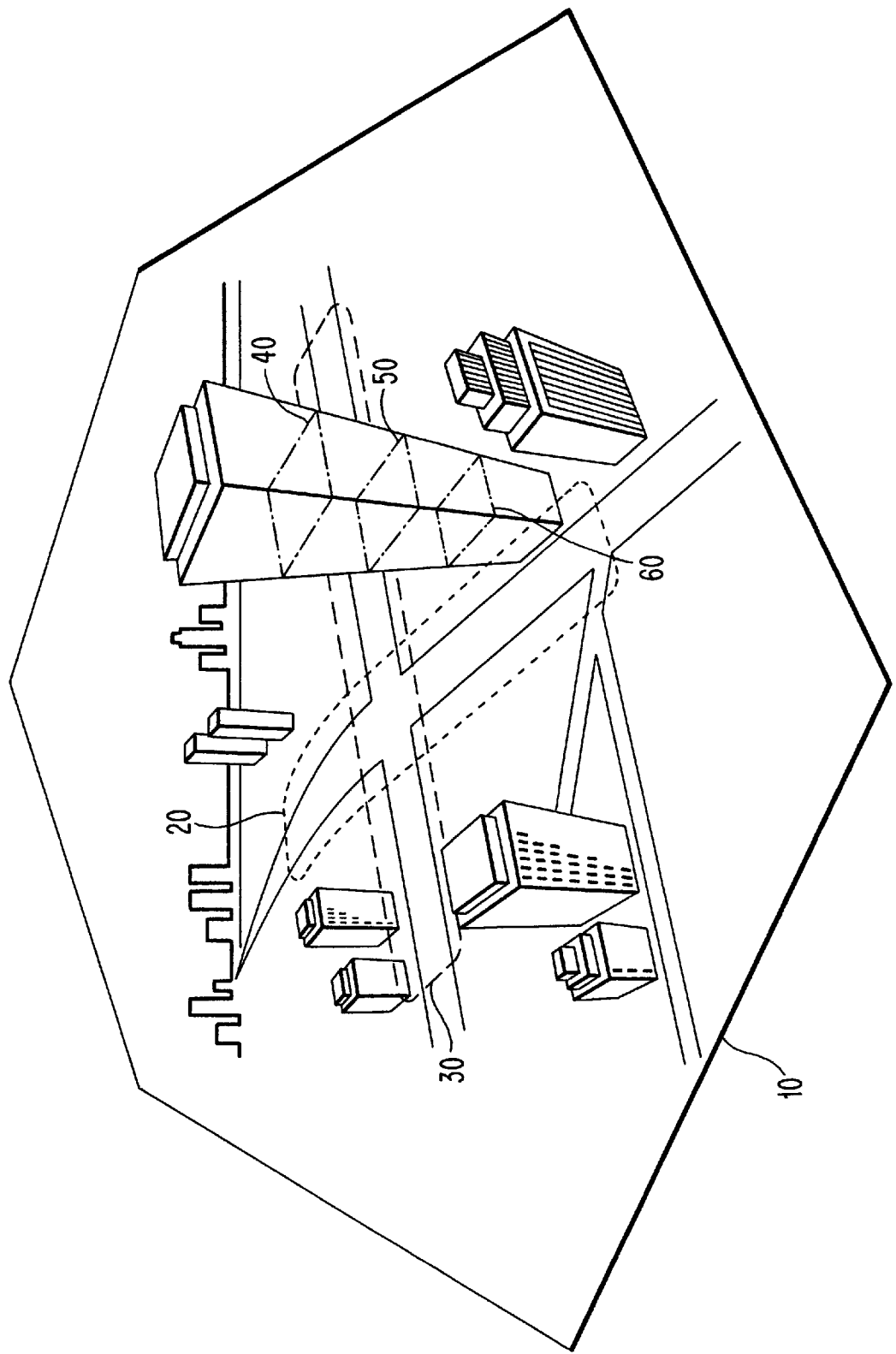
FIGS. 1A, 1B illustrate an exemplary multi-layered cellular system.
Figure 1B:
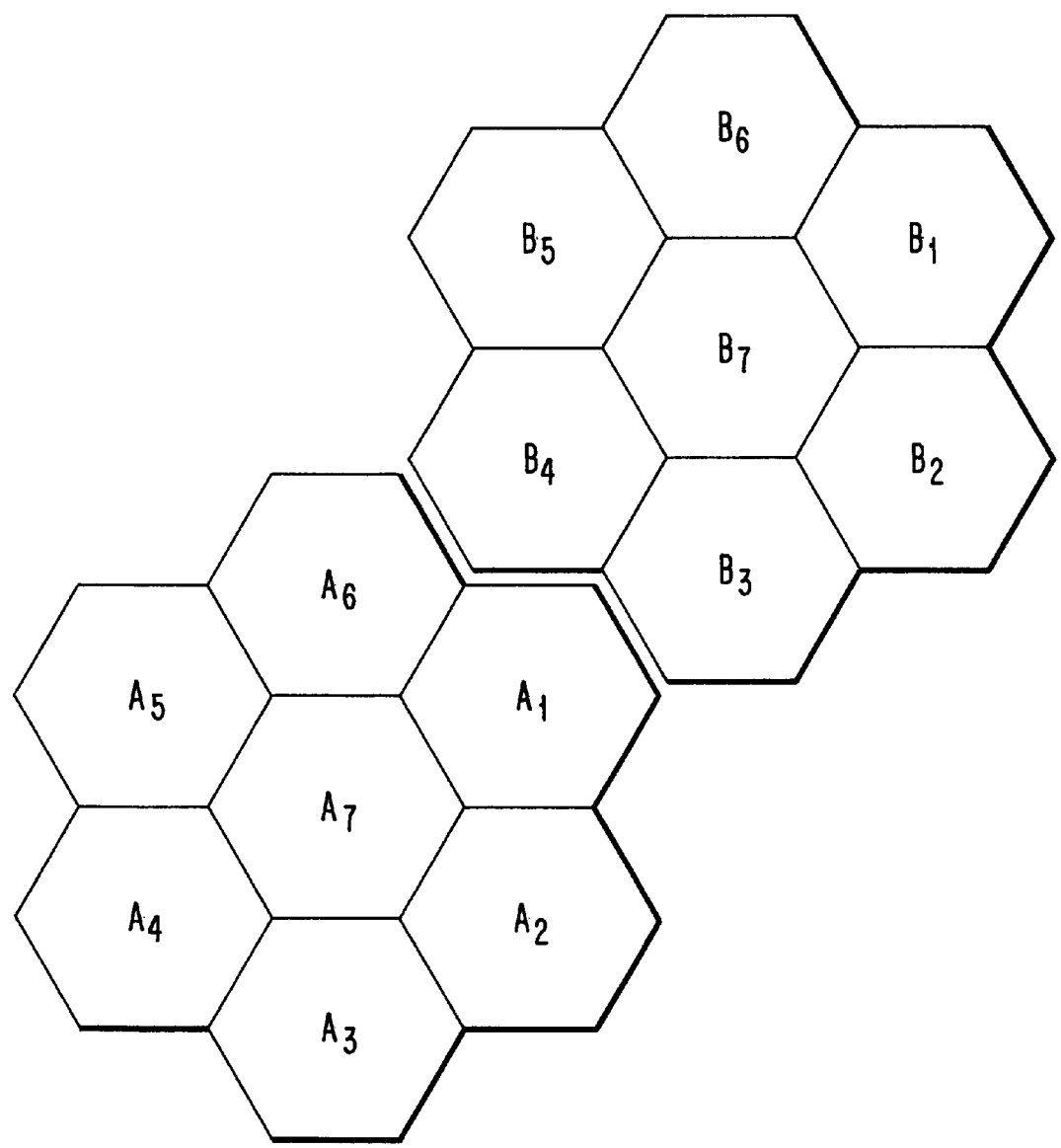
Figure 3:
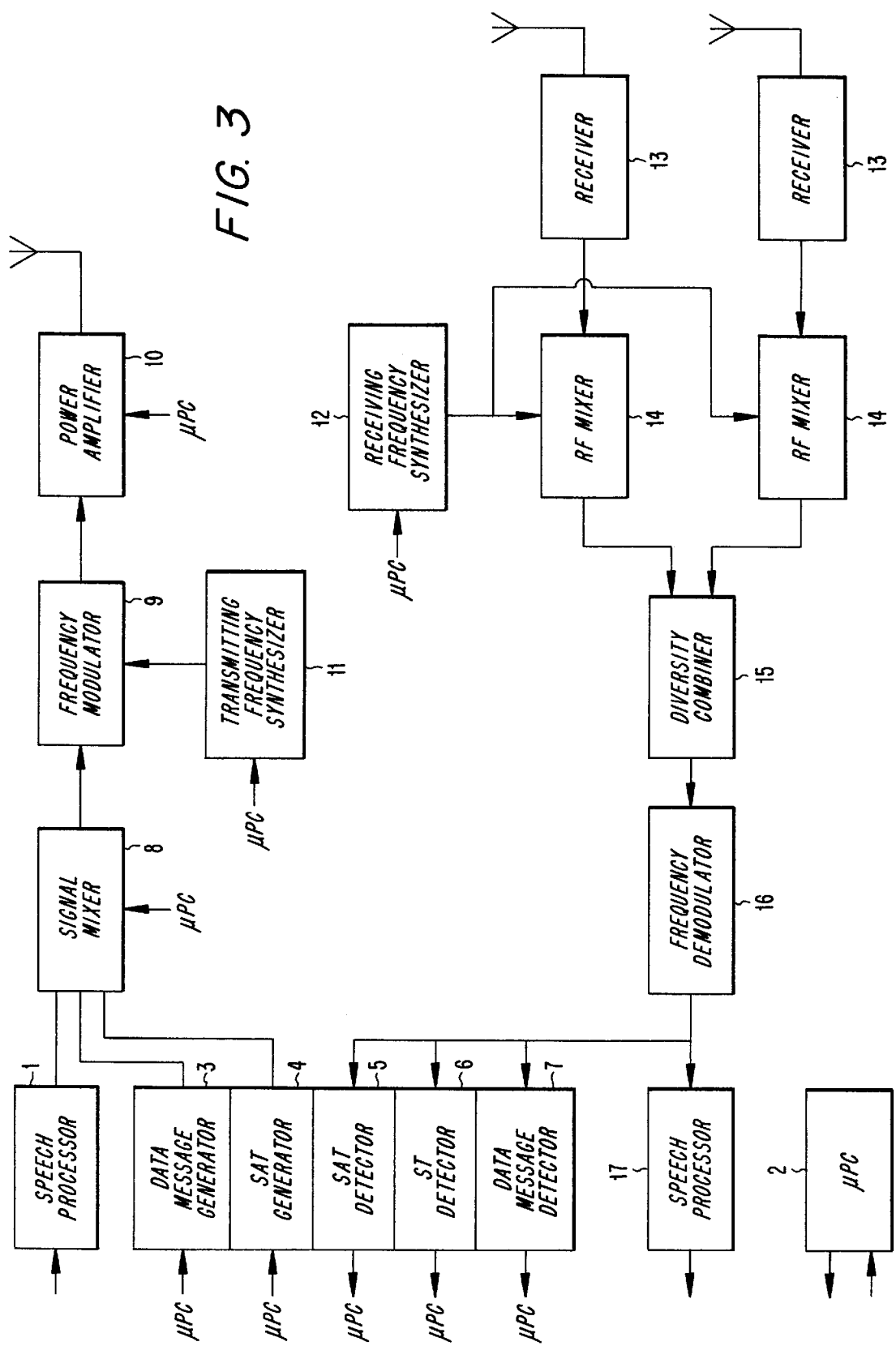
FIG. 3 is a block diagram of a transceiver module.

FIG. 3 is a block diagram of a transceiver module. A speech processor 1 converts an analog signal generated by, for example, the human voice into a signal designed to frequency modulate a carrier signal. The speech processor 1 comprises several stages: a dynamic range compressor, a pre-emphasis filter, a deviation limiter, and a post-deviation-limiter filter. As described below, the inverse of this signal processing is carried out when receiving. The speech processor 1 and the other components of the transceiver module are controlled by a microprocessor control unit 2.

Digital encoded data messages are used for signalling between the mobile station and the radio base station. Some messages are sent either on a forward control channel (FOCC) or a forward voice channel (FVC), which are channels from the base station to the mobile station. These encoded data messages typically include encoded data words formed from data words that are blocks of predetermined numbers of bits. In some telecommunication systems, 28-bit data words are produced by a data message generator 3 under control of the microprocessor 2 and are encoded by the generator 3 according to a BCH code for facilitating error protection and correction. The coding of the data bits and parity bits increases the word length to forty bits, viz., each encoded data word is formed by encoding twenty-eight content bits with a (40, 28) BCH code having a distance of five. Such a code can be indicated as a (40, 28; 5) BCH code.

Each encoded data word carried by a control channel is also provided with a sequence of bits used for bit synchronization, a sequence of bits used for word synchronization, and a digital color code (DCC) used for assuring that the right control channel is decoded. In general, the DCC identifies the group of cells that the cell transmitting this message belongs to. Encoded data words carried by a voice channel are provided with bit-sync and word-sync sequences, but not the DCC.

A supervisory audio tone (SAT) is used to assure that the right voice channel is used; the SAT is sometimes called an analog color code. The SAT is produced by an SAT generator 4 and is sent on the forward voice channel to the mobile station, which simply re-transmits the SAT to the base station on a reverse (mobile-to-base) voice channel. If the wrong SAT is detected on the reverse voice channel, data messages received by the base station on that reverse voice channel are ignored. Also, a signalling tone (ST) is produced by a suitable ST generator in the mobile station and is used for signaling on the reverse voice channel from the mobile station to the base station. The receiver in the base station includes a ST detector 6 for the ST.

The input speech, data, and SAT signals are filtered for limiting the carrier signal's bandwidth and combined into one signal by a signal mixer 8. The SAT signal modulates the speech signal, and transmission of the SAT is suspended during transmission of data messages.

The combined signal produced by the mixer 8 is provided to a frequency modulator 9, which impresses the combined signal onto an RF carrier signal as a carrier FM. The carrier signal is generated by a suitable frequency synthesizer 11. Either speech or data information modulates the carrier. The FM'd carrier may be up-converted to a higher frequency, if desired, and the modulated carrier is amplified to a predetermined power level by a power amplifier 10 in accordance with the selected transmitting channel.

Radio signals received from a mobile station are suitably filtered and amplified by two receivers 13, and the modulated carrier signals are demodulated by mixers 14 for generating the original FM'd signal. The mixers 14 combine the modulated carriers with a signal having the carrier frequency that is generated by a receiving frequency synthesizer 12 in accordance with the selected receiving channel. To decrease the effects of multipath fading, two receiving antennas are typically used, and the signals generated by the mixers are combined into one common signal by a suitable diversity combiner 15. A frequency demodulator 16 extracts the encoded data messages, SAT, ST, and speech from the original FM'd signal generated by the diversity combiner 15.

The encoded data messages received from the mobile station are detected and decoded by a data message detector 7 according to the appropriate BCH code. The speech signal from the frequency demodulator 16 is converted into an analog signal by a speech processor 17 by filtering, de-emphasis, and expansion. A SAT detector 5 detects the SAT signal for determining that the proper SAT signal is present.

Encoded digital data messages are sent from the mobile station to the base station on a reverse control channel (RECC). In the TACS system, the RECC data stream has a rate of 8 kilobits/second, ±1 bit/second. FIG. 4 depicts the format of the RECC data stream transmitted by a mobile station in a TACS system. A RECC message comprises a seizure precursor and between one and five word blocks, each word block comprising five repetitions of a respective encoded data word.

The seizure precursor comprises a 30-bit dotting sequence (1010 . . . 1010) used for bit synchronization, an 11-bit word-sync sequence (11100010010), and a 7-bit encoded DCC. The bit-sync and word-sync sequences are used in a conventional way to help ensure accurate reception of the other data fields. The encoded DCC is obtained by translating the DCC received on the FOCC according to the following table.

| Received DCC | Encoded DCC |
|---|---|
| 00 | 0000000 |
| 01 | 0011111 |
| 10 | 1100011 |
| 11 | 1111100 |

After the seizure precursor, the RECC encoded data words are transmitted by the mobile station. Each encoded data word comprises forty-eight bits, including twelve parity bits, and is repeated five times as described above. Each RECC encoded data word is formed by encoding thirty-six content bits with a (48, 36; 5) BCH code. The left-most bits (i.e., the bits occurring earlier in time) are designated the most-significant bits, and the thirty-six most-significant bits of the 48-bit field are the content bits. The TACS standard provides that the generator polynomial for the BCH code used on the RECC is the same as the generator polynomial used for the (40, 28; 5) BCH code used on the FOCC.

The types of messages carried by the RECC are page response messages for answering calls; origination messages for making calls; order messages; and order confirmation messages. Each of these messages is made up of a combination of an abbreviated address word having a format shown in FIG. 5A, an extended address word having a format shown in FIG. 5B, a serial number word having a format shown in FIG. 5C, a called address (first word) having a format shown in FIG. 5D, a called address (second word) having a format shown in FIG. 5E, a called address (third word) having a format shown in FIG. 5F, and a called address (fourth word) having a format shown in FIG. 5G.

As seen in FIGS. 5A–5G, each 48-bit RECC encoded data word comprises a plurality of fields. The numbers of bits in the fields are indicated in FIGS. 5A–5G by the numerals below the fields. The F field includes one bit for indicating whether this is the first data word of the message. The bit in this field is set to "1" in the first data word and to "0" in subsequent words. The NAWC field indicates the number of additional words coming in the message, i.e., one, two, three, or four.

The bit in the message type field T is set to "1" to identify the message as an origination or an order and is set to "0" to identify the message as a page response or an order confirmation. The bit in the send serial number field S is set to "1" if the serial number word is sent and is set to "0" if the serial number word is not sent. The bit in the extended address field E is set to "1" if the extended address word is sent and to "0" if the extended address word is not sent. The station class mark field SCM indicates the type of mobile station and its maximum output power.

The order field identifies the type of order message. The order qualifier field ORDQ qualifies the order field to a specific action. For the bits in the local control field to be interpreted, the order field must be set to local control or charge rate: if the order field is set to local control, then the field is specific to each system; if the order field is set to charge rate, then the local control field forms part of the charge rate qualifier word.

The field LT is for last-try codes, the field MIN1 is for the first part of the mobile identification number, and the field MIN2 is for the second part of the mobile identification number. The serial number field identifies the serial number of the mobile station.

The digit field comprises bits encoded as shown in the following table.

| Digit | Code |
|---|---|
| 1 | 0001 |
| 2 | 0010 |
| 3 | 0011 |
| 4 | 0100 |
| 5 | 0101 |
| 6 | 0110 |
| 7 | 0111 |
| 8 | 1000 |
| 9 | 1001 |
| 0 | 1010 |
| * | 1011 |
| # | 1100 |
| Null | 0000 |

In the table, it will be noted that the digit "0" is encoded as binary "ten", not binary "zero" which is used as the null code for indicating no digit. All of the other 4-bit codes are reserved.

The MSSUPLEV field is the TACS support level field, equal to the value of MS_SUP_LEV_s. The RSVD field is reserved for future use, and all bits are set to a predetermined value. The parity field P includes the twelve parity bits associated with the thirty-six information content bits.

Examples of encoding called-address information into the called-address words are shown in FIGS. 6A–6D. If the digits 2# are dialed, the word is as shown in FIG. 6A. If the number 13792640 is entered, the word is as shown in FIG. 6B. If the digits *24273258 is entered, the words are as shown in FIGS. 6C, 6D. In FIGS. 6A–6D, the field NOTE comprises four bits that depend on the type of message.

In accordance with Applicant's invention, the chances of decoding a useful word are increased by adding to the old principle of simple bit-wise majority voting of all of the words received and decoding the result of the vote. As used in this application, "decoding" means using a group of parity bits that have been received to determine whether an associated group of data bits has been received with no errors and to correct one or more errors in the associated group of data bits. As additional information according to the invention, every word received is decoded, not just the result of the bit-wise majority vote, and if a word received is decoded as correct or with a corrected one-bit error or with a corrected two-bit error, this decoded word can be used as the received word. Also, bit-wise majority votes can be taken on all combinations of three words received (for a word repeated five times, there are ten such combinations), and the results passed to the decoder. If the decoder reports a correct word or a word having a one-bit or two-bit error corrected for one of these combinations, this can be used as the received word.

In one aspect, Applicant's invention enables correction of words that are encoded according to a (48, 36; 5) BCH code and that have three erroneous bits. This capability is beyond the typical capabilities of such a BCH code and thus might be called "super-correction". Such super-correction is realized if, as explained in more detail below, the error-correction decoder is configured so that it does not correct a bit value that is the result of a unanimous majority vote. For example in a case of five votes, bit values produced by 5/0 votes are not changeable and bit values produced by 4/1 and 3/2 votes are changeable. This is functionally equivalent to masking the bits produced by the voting, and for the five-vote example it may be called a "4/1 & 3/2 bit mask".

It is also advantageous to configure the error-correction decoder so that it does not correct a bit value that is the result of either a unanimous majority vote or a vote in which only one candidate word casts a dissenting vote. For example in a case of five votes, bit values produced by 5/0 votes and 4/1 votes are not changeable; only bit values produced by 3/2 votes are changeable. For the five-vote example, this may be called a "3/2 bit mask".

Applicant's method will find a suitable combination in a large number of cases, cases that would produce incorrectable results with conventional decoding. To help prevent Applicant's method from yielding false results, the number of changeable bits may be used as a constraint that varies according to the number of bits that are corrected during decoding: if a selected value of this number is exceeded for a word to be decoded, that word is reported as incorrectable.

Figure 7A:
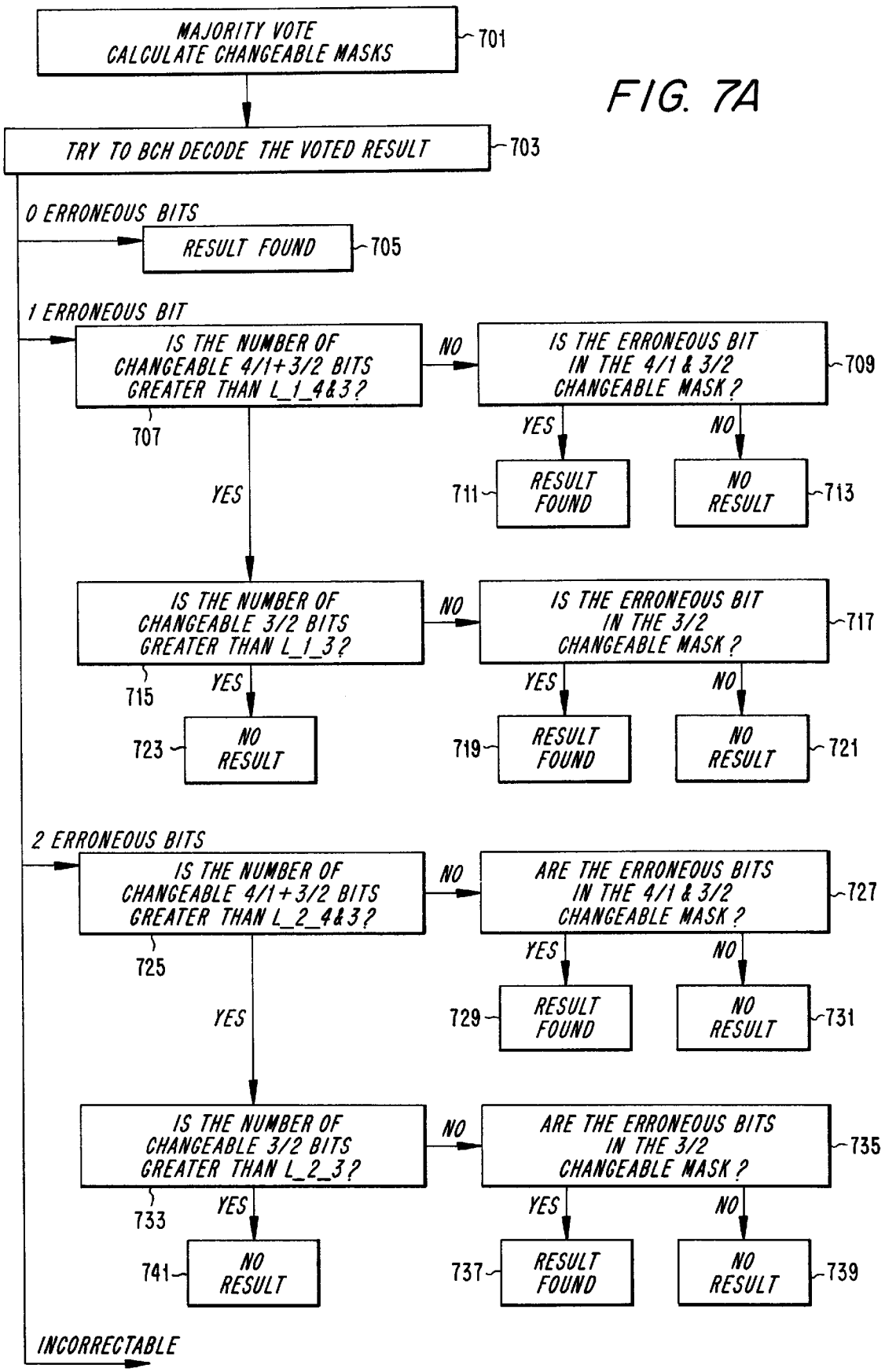
FIGS. 7A, 7B are a flow chart of a method in accordance with Applicant's invention.
Figure 7B:
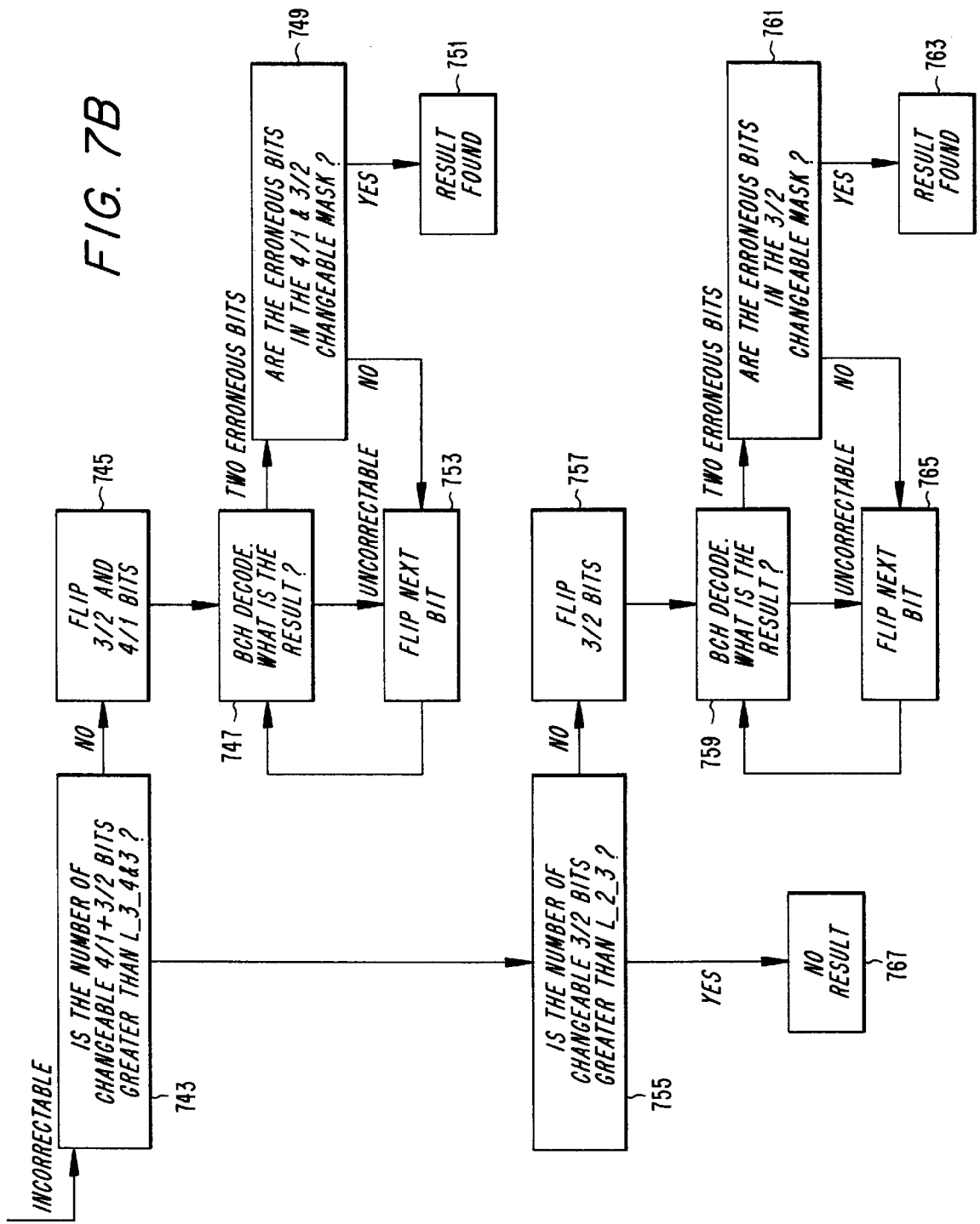

In FIGS. 7A, 7B, this constraint when applied to a three-bit-error correction is indicated as L_3_4&3 for the 4/1 & 3/2 bit mask and as L_3_3 for the 3/2 bit mask. When applied to a two-bit-error correction, this constraint is indicated in FIGS. 7A, 7B as L_2_4&3 for the 4/1 & 3/2 bit mask and as L_2_3 for the 3/2 bit mask. When applied to a one-bit-error correction, this constraint is indicated in FIGS. 7A, 7B as L_1_4&3 for the 4/1 & 3/2 bit mask and as L_1_3 for the 3/2 bit mask.

Provision of the "super-resolution" capability is illustrated by the following example:

|  | Data Bits Sent | Parity Bits Sent |
| --- | --- | --- |
|  | 1111111 | 1111 |
|  | Data Bits Received | Parity Bits Received |
|  | 0001111 | 1111 |
|  | 1010101 | 1111 |
|  | 1011110 | 1111 |
|  | 1000110 | 0000 |
|  | 1011100 | 0000 |
| bit-wise majority vote: | 1001110 | 1111 |

Applying the 4/1 & 3/2 bit mask, only the second and fifth bits of the voting result 1001110 are not changeable, i.e., not candidates for error correction. In accordance with Applicant's decoding method illustrated in FIGS. 7A, 7B, every possible combination of these candidates would be tested in an effort to determine a combination producing a decoded set of data bits that matches the majority voting result of the received parity bits. Also, applying the 3/2 bit mask, only the first, second, and fifth bits of the voting result 1001110 are not candidates for error correction, and every possible combination of these candidates would be tested in an effort to determine a combination producing a decoded set of data bits that matches the majority voting result of the received parity bits.

Thus, as illustrated in FIG. 7A, determining a received word in accordance with Applicant's invention includes a first step 701 of taking a bit-wise majority vote of a set of repeated words and applying the bit masks to determine which bits of the voting result are changeable, i.e., subject to being corrected by the decoder. The next step 703 is to try to decode the voting result. If the result of the decoding step 703 indicates that no bits need to be corrected, then the decoded result has been found (block 705).

If the decoding step 705 produces an indication that one bit of the decoded result needed error correction, then the L_1_4&3 constraint is applied in step 707. If the number of changeable bits is not greater than the valve selected for this constraint, then it is determined (step 709) whether the indicated one erroneous bit was one of the changeable bits according to the 4/1 & 3/2 bit mask, i.e., that the erroneous bit was a bit permitted to be corrected. If so, the (corrected) decoded result has been found (step 711); if not (step 713), the decoder reports as incorrectable the voting result produced in step 701.

If the number of changeable bits is greater than the value selected for the L_1_4&3 constraint in step 707, then the L_1_3 constraint is applied in step 715. If the number of changeable bits is not greater than the value selected for the L_1_3 constraint, it is determined (step 717) whether the indicated one erroneous bit was one of the changeable bits according to the 3/2 bit mask, i.e., that the erroneous bit was a bit permitted to be corrected. If so, the (corrected) decoded result has been found (step 719); if not (step 721), the decoder reports as incorrectable the voting result produced in step 701.

If the number of changeable bits is greater than the value selected for the L_1_3 constraint in step 715, then (step 723) the decoder reports as incorrectable the voting result produced in step 701.

If the decoding step 705 produces an indication that two bits of the decoded result needed error correction, then the L_2_4&3 constraint is applied in step 725. If the number of changeable bits is not greater than the value selected for this constraint, then it is determined (step 727) whether the indicated one erroneous bit was one of the changeable bits according to the 4/1 & 3/2 bit mask. If so, the (corrected) decoded result has been found (step 729); if not (step 731), the decoder reports as incorrectable the voting result produced in step 701.

If the number of changeable bits is greater than the value selected for the L_2_4&3 constraint in step 725, then the L_2_3 constraint is applied in step 733. If the number of changeable bits is not greater than the value selected for the L_2_3 constraint, it is determined (step 735) whether the indicated two erroneous bits were two of the changeable bits according to the 3/2 bit mask. If so, the (corrected) decoded result has been found (step 737); if not (step 739), the decoder reports as incorrectable the voting result produced in step 701.

If the number of changeable bits is greater than the value selected for the L_2_3 constraint in step 733, then (step 741) the decoder reports as incorrectable the voting result produced in step 701.

If the decoding step 705 produces an indication that the voting result produced in step 701 cannot be properly decoded due to the presence of more than two error bits, then the L_3_4&3 constraint is applied in step 743 shown in FIG. 7B. If the number of changeable bits is not greater than the value selected for this constraint, then one of the bit values due to a 4/1 or 3/2 vote is inverted (step 745), thereby forming a modified voting result. It is currently believed to be preferable to select changeable bit values due to 3/2 votes for inversion before selecting changeable bit values due to 4/1 votes. An attempt is made (step 747) to decode the modified voting result produced by step 745. If decoding is possible with a two-bit-error correction, it is determined (step 749) whether the indicated two erroneous bits were two of the changeable bits according to the 4/1 & 3/2 bit mask. If so, the (corrected) decoded result has been found (step 751); if not, the bit value of another one of the changeable bits is inverted and the bit value that was inverted in step 745 is changed back (step 753). An attempt is then made (step 747) to decode the modified voting result produced by step 753, and steps 747–753 are repeated until all of the changeable bit values have been inverted and either a decoded result is found or not.

If the number of changeable bits is greater than the value selected for the L_3_4&3 constraint in step 743, then the L_2_3 constraint is applied in step 755. If the number of changeable bits is not greater than the value selected for this constraint, then one of the changeable bit values is inverted (step 757). Since the changeable bits are all due to 3/2 votes, it does not matter which changeable bit value is selected for inversion. An attempt is made (step 759) to decode the modified voting result produced by step 757. If decoding is possible with a two-bit-error correction, it is determined (step 761) whether the indicated two erroneous bits were two of the changeable bits according to the 3/2 bit mask. If so, the (corrected) decoded result has been found (step 763); if not, the bit value of another one of the changeable bits is inverted and the bit value that was inverted in step 757 is changed back (step 765). An attempt is then made (step 759) to decode the modified voting result produced by step 765, and steps 759–765 are repeated until all of the changeable bit values have been inverted and either a decoded result is found or not.

If the number of changeable bits is greater than the value selected for the L_2_3 constraint in step 755, then (step 767) the decoder reports as incorrectable the voting result produced in step 701.

It will be appreciated that this idea does not change significantly when it is applied in a communication system in which each word is transmitted fewer or more than five times. Moreover, the number of times each word is transmitted does not have to be odd, although the chances of a tie in a majority vote of an even number of voters are greater than the chances of a tie in a majority vote of an odd number of voters.

Applicant's method increases the probability of accurately determining a word that was actually transmitted from a plurality of repetitions of the word received after passage through a corrupting communication channel. Applicant's method increases this probability especially for situations in which short bursts of erroneous data are received.

The particular values selected for the constraints represent tradeoffs between the rate of incorrectly decoded results and the rate of correctly decoded results. For a (48, 36; 5) BCH code and five-word votes, it currently seems preferable for the L_3_4&3 value to be set at six, for the L_3_3 value to be set at about five, for the L_2_4&3 value to be set at about twelve, for the L_2_3 value to be set at about eight, for the L_1_4&3 value to be set at about twenty-five, and for the L_1_3 value to be set at about twenty. In general, the constraint values would be set empirically, keeping in mind that to correct three-bit errors, the number of changeable bits should be few (the porosities of the bit masks should be low) while to correct one-bit errors the number of changeable bits can be greater (the porosities of the bit masks can be higher). Applying these constraint values in carrying out the method of FIGS. 7A, 7B on the (erroneous) voting result 1001110 derived in the foregoing example corrects the three-bit error.

It will be appreciated that the method shown in FIGS. 7A, 7B can be modified to consider soft quality information that may be generated by the frequency demodulator 16 and provided to the data message detector 7 to assist in pinpointing and correcting likely erroneous bits. The development and use of soft quality information in bit-wise majority voting is described in U.S. patent application Ser. No. 08/059,932 that was cited above and that is incorporated here by reference. When a majority vote of an even number of voters is taken, using "soft" majority voting as described in that application rather than "hard" majority voting is more likely to yield a usable result. U.S. patent application Ser. No. 08/218,236 filed Mar. 28, 1994, by Dent and entitled "Diversity Pi/4 DQPSK Demodulation" also describes the use of soft quality information and is incorporated here by reference.

Soft quality information (SQI) can also be used in the determination of the changeable bit masks. For example in the steps involving bit-value inversion, bit values having lower SQI (lesser quality) can be selected for inversion before bit values having higher SQI.

It will further be appreciated that the method shown in FIGS. 7A, 7B can be modified to consider available a priori knowledge of the information received. Such knowledge would be used to constrain the number and/or the positions of bit values that are deemed changeable, i.e., open to correction.

As an alternative to the method illustrated in FIGS. 7A, 7B, the group of repeated words participating in a bit-wise majority vote can be derived, or compiled, by using a sliding window to select sets of contiguous bits from the received encoded repetitions of the data word. As described below in connection with FIGS. 8, 9A–9D, the bits in each set are re-ordered in accordance with the error correction coding, a bit-wise majority vote of the re-ordered sets is taken, and the result of the vote is decoded.

FIG. 8 illustrates a sliding window disposed in four positions 801, 802, 803, 804 with respect to a sequence of five encoded repetitions of a data word. (For clarity, only repetitions 1 and 2 are shown as comprising strings of 1's and 0's.) In each position, the sliding window determines a respective set of bits that is re-ordered if necessary to form a compiled word, which is then decoded. In FIG. 8, the second of the two sets of bits selected from repetition 1 and the set of bits selected from repetition 2 are re-ordered in the compiled word. The positioning of the sliding window and re-ordering of the bits are operations readily carried out by the data message detector 7 (see FIG. 3).

In general, a compiled word is compiled by assembling fractions from different locations of the repetitions. The number of bits included in the sliding window is determined by the length of the data word. For RECC encoded data words as described above, each position of the window would include forty-eight bits. For simplicity, sequential analysis of each sequence of repetitions is currently preferred, as illustrated by FIGS. 9A–9D.

FIG. 9A shows that the first repetition received is used as the first compiled word; in other words, the sliding window perfectly overlaps repetition 1 and no re-ordering of the included bits is needed. In FIG. 9B, the window slides over a number of bits, overlapping both repetitions 1 and 2; the second compiled word thus comprises a re-ordered set of bits from repetition 2 and a set of bits from repetition 1. FIG. 9C shows the window having slid over another number of bits, but still overlapping both repetitions 1 and 2. The sliding window thus proceeds through the sequence of repetitions until the last compiled word is generated as illustrated in FIG. 9D. It will be appreciated that, in effect, the window slides around a ring of the repetitions.

The number of bits between each position of the window, viz., the number of bits that are included at one position and that are not included at the succeeding position of the window, is determined primarily by the speed of the processor carrying out the operations of the data message detector. The number of bits that the window slides represents a tradeoff between required processing speed and desired increase in probability of successful decoding. It is currently believed that allowing eight bits between each window position for the above-described RECC data words is advantageous. Thus, a total of thirty window positions would occur for the five repetitions of each RECC data word.

The compiled data words, i.e., the encoded data bits included in each window position, are decoded. The BCH decoder will report a word as correct when a one-bit-error correction is allowed in about one percent of the cases during reception of random data. In the RECC example, this would result in 30×1%, or 30%, false results, which is not acceptable. Accordingly, an acceptance constraint is applied that requires a compiled word decoded without any correction to be accepted or that requires at least two of the compiled words to be decoded to an identical result with the bits that have been corrected having different positions in the compiled words.

Figure 10:
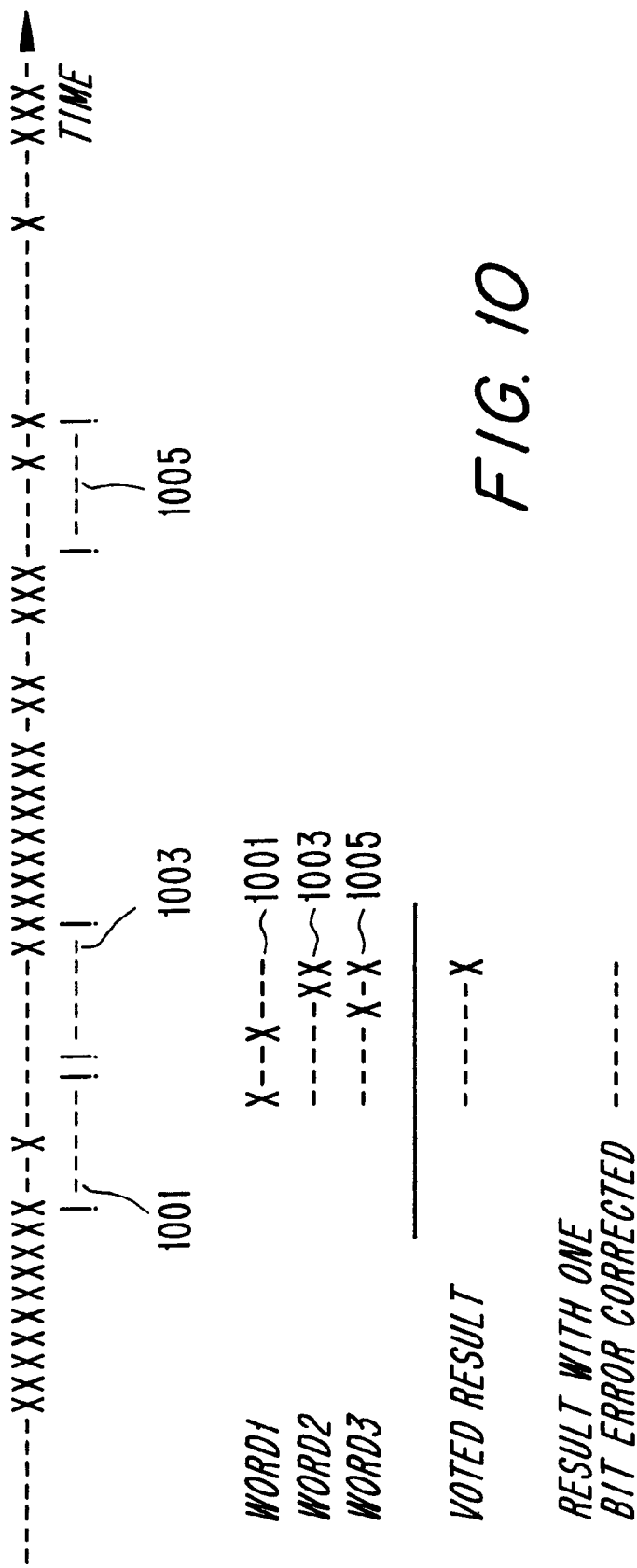
FIG. 10 illustrates re-organizing a group of repeated words into smaller groups.

As an alternative to the methods illustrated in FIGS. 7A, 7B, 8, and 9A–9D, the group of repeated words can be re-organized into smaller groups, a bit-wise majority vote can be taken in each smaller group, and the results of the votes can be decoded. This is illustrated in FIG. 10, which shows a stream of received data bits. Bits that have been correctly received are indicated by "–", and bits that have been incorrectly received (due to noise, for example), are indicated by "×". It can be seen that the received bit stream is corrupted by bursts of noise, i.e., long contiguous groups of noise bits, and by random noise that occurs in only one or a few contiguous bits.

If it is assumed that the stream includes a sequence of five seven-bit repetitions of a data word, decoding the result of a bit-wise majority vote of all five words may produce an indication that the result is incorrectable due to the long noise bursts. FIG. 10 shows one smaller group of three bit sets 1001, 1003, 1005. The result of a bit-wise majority vote of the three bit sets still has one error, but this error can be corrected during decoding, yielding a correctly decoded result. Since, in general, there would be more than one such group, these smaller groups can be selected using non-overlapping windows in a cut-and-try method or in more intelligent methods using SQI. Each smaller group may be considered a "compiled word" as described above that includes bits selected by a window disposed either at one respective position covering the appropriate number of bits (the number in a received encoded repetition of the data word) or at a number of respective positions that include numbers of bits that sum to the appropriate number. The results of the votes of these smaller groups can be combined through word-wise majority voting as described below.

As a way of further increasing the chances of accurately determining a transmitted data word, the words participating in the voting in step 701 of FIG. 7A can be derived, or even supplemented, by using the sliding window (FIGS. 8, 9A–9D) and/or by dividing the repetitions into smaller groups. The resulting decoded words are then analyzed in accordance with the remaining steps shown in FIGS. 7A, 7B. When dividing into smaller groups is used, the changeable bit masks may be adjusted accordingly; in the example shown in FIG. 10, the changeable bit values would be those that resulted from 2/1 majority votes.

It is believed that the sliding window is the best one of these three techniques to use when the data is corrupted by bursts of noise, i.e., long contiguous groups of noise bits, which is the condition produced by channel fading. Taking a majority vote of the compiled words and applying the changeable bit masks to the result (step 701 in FIG. 7A) is advantageous because a larger number of words participate in the vote. Error correcting up to three bits (FIGS. 7A, 7B) seems likely to be the best method when the data suffers from random noise that occurs in only one or a few contiguous bits at a time. The grouping method seems likely to the best when the data suffers from such random noise in between longer bursts of noise (fading).

The sliding window (FIGS. 9A–9D) and the grouping method (FIG. 10) can produce several decoded results that each appear to be correct, and the three-bit-error correction method (FIGS. 7A, 7B) can also produce a result that appears to be correct. To determine which result is correct, a majority vote is taken and the type result that has the most occurrences (the most "votes") is deemed the correct one. It will be appreciated that the majority vote taken is not a bit-wise majority vote. Instead, the number of each type of decoded word is tallied. (The "type" of a result simply refers to the particular sequence of bit values in the decoded word; for example, the four-bit word 1111 is a type that is different from the type of the four-bit word 1110.) This is called word-wise majority voting in this application.

In word-wise voting, each result may be given a respective weight that would depend on parameters such as how many bits were corrected to obtain the result, whether the result is correlated to another result that was produced from substantially the same received bits, the quality of the received bits (SQI) on which the result is based, or the method used to obtain the result. Using any of these parameters will increase the probability that the correct result is chosen in the word-wise voting.

To minimize the chances that the incorrect result is chosen, it is believed advisable to require at least a minimum sum that the weighted result of word-wise voting must achieve in order to be considered correct. If the weighted result fails to equal or exceed the minimum sum, it is discarded, and the result is indicated as incorrectable. As just one example, the minimum sum can be set to a value of three, the result from bit-wise voting of the received words may be given a weight of two, and the other voting results can each be given a weight of one.

All of the signal processing operations carried out in the transceiver shown in FIG. 3 can be performed in the digital domain by a suitable digital signal processing (DSP) device. With such a configuration, almost any type of modulation can be detected by programming the DSP device to appropriately manipulate digital samples of a received radio signal, as described for example in U.S. patent application Ser. No. 07/967,027 to Dent et al. for "Multi-Mode Signal Processing", which is expressly incorporated here by reference.

The DSP device may be implemented as hard-wired logic circuitry, or, preferably, as an integrated digital signal processor, such as an application-specific integrated circuit (ASIC). Of course it will be understood that an ASIC may include hard-wired logic circuitry that is optimal for performing a required function, which is an arrangement commonly selected when speed or another performance parameter is more important than the versatility of a programmable digital signal processor.

In addition, since it may be desirable to reduce the electric power consumption of the processor, not all steps described above need be carried out. For example, a processor in a base station can afford to expend power in order to use every scrap of information available and maximize the probability of correctly determining a data word transmitted by a mobile station, and thus a base station would tend to use all steps of the method. Since electric power is usually at a premium in a mobile station like a hand-held phone, the mobile's processor might not employ the sliding window and bit-weighting with soft information steps of the method.

Although this description has considered the processing of information transmitted on a RECC, Applicant's invention can be used in processing redundantly transmitted information on any communication channel, such as the FOCC. It is simply necessary for the signal processor in the receiver to be fast enough to keep up with the information as it is received, assuming other receiver constraints such as size, weight, power consumption, etc., are met.

It will be understood that Applicant's invention is not limited to the particular embodiments that have been described and illustrated. This application contemplates any and all modifications that fall within the spirit and scope of Applicant's invention as defined by the following claims.

What is claimed is:

1. A method of determining a decoded received data word from a plurality of received encoded repetitions of the data word, each repetition including a number of bits, comprising the steps of:

compiling an encoded repetition of the data word by selecting bits from at least two of the plurality of received encoded repetitions of the data word, wherein the selected bits appear in the compiled encoded repetition in the same order as they appear in each of the at least two received encoded repetitions and wherein the compiled encoded repetition of the data word comprises said number of bits;

decoding the complied encoded repetition according to an error correcting code, thereby determining the decoded received data word; and taking a bit-wise majority vote of a compiled encoded repetition and words selected from a group comprising at least one other compiled encoded repetition and the received encoded repetitions, thereby forming a bit-wise-vote result, wherein the decoded received data word is determined by decoding the bit-wise-vote result.

2. The method of claim 1, wherein the bits in the compiled encoded repetition are selected by a moving a window among a plurality of positions, the window at each position including said number of contiguous bits.

3. The method of claim 1, wherein the bit-wise-vote result is formed by taking a bit-wise majority vote of a plurality of compiled encoded repetitions.

4. The method of claim 1, wherein the bits in the compiled encoded repetition are selected by a window that includes a number of contiguous bits that is the same as the number of bits in a received encoded repetition.

5. The method of claim 1, wherein the bits in the compiled encoded repetition are selected by moving a window among a plurality of positions, the window at each position including a number of contiguous bits that is less than the number of bits in a received encoded repetition.

6. The method of claim 1, wherein the decoding step produces a decoded result, and the compiling and decoding steps are carried out a plurality of times to produce a plurality of decoded results, the method further comprises the step of taking a word-wise majority vote of the decoded results, and a result of the word-wise majority vote is reported as the decoded received data word.

7. The method of claim 6, wherein the step of taking a word-wise majority vote comprises the step of determining a type of decoded result that has the most votes, and the decoded received data word is a candidate for a correct, received word.

8. The method of claim 6, wherein each decoded result has a respective weight and the result of the word-wise majority vote is reported as the decoded received data word if a sum of the weights of the decoded results that have the same type as the type of the result of the word-wise majority vote is greater than or equal to a predetermined value.

9. A method of determining a decoded received data word from a plurality of received encoded repetitions of the data word, each repetition including a plurality of bits, comprising the steps of:

taking a bit-wise majority vote of a selected group of the plurality of received encoded repetitions words, thereby forming a bit-wise-vote result;

determining which bits of the bit-wise vote result are changeable by applying a bit mask to the bit-wise vote result; and decoding the bit-wise-vote result according to an error correcting code and the applied bit mask, thereby determining the decoded received data word.

10. The method of claim 9, wherein a bit of the bit-wise vote result is determined to be changeable according to a number of votes for that bit in the bit-wise majority vote.

11. The method of claim 9, wherein the determining step includes determining whether a number of changeable bits is greater than a constraint value;

and the decoding step includes the steps of:
  decoding the bit-wise-vote result, thereby forming a decoded result;
  if the decoded result includes an error-corrected bit and the number of changeable bits is not greater than the constraint value, then determining whether the error-corrected bit is a changeable bit; and
  if the error-corrected bit is a changeable bit, reporting the decoded result as the decoded received data word.

12. The method of claim 9, wherein the determining step includes determining whether a number of changeable bits is greater than a constraint value;

and if the number of changeable bits is not greater than the constraint value and if the bit-wise-vote result is incorrectable in the decoding step, the decoding step includes the steps of:
  inverting a selected one of the changeable bits, thereby forming a modified voting result;
  decoding the modified voting result, thereby forming a decoded result that includes an error-corrected bit;
  determining whether the error-corrected bit is a changeable bit; and
  if the error-corrected bit is a changeable bit, reporting the decoded result as the decoded received data word.

13. The method of claim 12, wherein a changeable bit is selected for inversion based on soft quality information for that bit.

* * * * *